United States Patent
Nam et al.

(10) Patent No.: US 12,033,973 B2
(45) Date of Patent: Jul. 9, 2024

(54) SEMICONDUCTOR PACKAGE

(71) Applicant: Samsung Electronics Co., Ltd., Suwon-si (KR)

(72) Inventors: Soohyun Nam, Yongin-si (KR); Younglyong Kim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 145 days.

(21) Appl. No.: 17/367,995

(22) Filed: Jul. 6, 2021

(65) Prior Publication Data

US 2022/0189907 A1 Jun. 16, 2022

(30) Foreign Application Priority Data

Dec. 11, 2020 (KR) .................. 10-2020-0173679

(51) Int. Cl.
| | |
|---|---|
| *H01L 23/31* | (2006.01) |
| *H01L 23/00* | (2006.01) |
| *H01L 23/498* | (2006.01) |
| *H01L 25/065* | (2023.01) |

(52) U.S. Cl.
CPC ........ *H01L 24/73* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 24/32* (2013.01); *H01L 25/0655* (2013.01); *H01L 2224/16235* (2013.01); *H01L 2224/32056* (2013.01); *H01L 2224/32059* (2013.01); *H01L 2224/32235* (2013.01); *H01L 2224/73204* (2013.01); *H01L 2924/1431* (2013.01); *H01L 2924/1434* (2013.01); *H01L 2924/1815* (2013.01); *H01L 2924/182* (2013.01); *H01L 2924/3512* (2013.01)

(58) Field of Classification Search
CPC .. H01L 23/3135; H01L 23/3192; H01L 23/31
See application file for complete search history.

(56) References Cited

U.S. PATENT DOCUMENTS

| | | | |
|---|---|---|---|
| 8,604,615 | B2 | 12/2013 | Lee et al. |
| 8,884,427 | B2 | 11/2014 | Woychik et al. |
| 9,570,369 | B1 | 2/2017 | Shih et al. |
| 9,941,180 | B2 | 4/2018 | Kim et al. |
| 10,504,824 | B1 | 12/2019 | Pan et al. |
| 10,651,133 | B2 | 5/2020 | Lee |

(Continued)

FOREIGN PATENT DOCUMENTS

| | | | | |
|---|---|---|---|---|
| JP | | 3836349 B2 | * 10/2006 | ............ H01L 24/32 |
| KR | | 10-1787832 B1 | 10/2017 | |
| KR | 10-2018-0091307 A | | 8/2018 | |

*Primary Examiner* — Michele Fan
(74) *Attorney, Agent, or Firm* — Harness, Dickey & Pierce, P.L.C.

(57) ABSTRACT

A semiconductor package including an interposer substrate, first to third semiconductor chips on the interposer substrate to face each other, an underfill part between each of the first to third semiconductor chips and the interposer substrate, a first side-fill part extending upward from a lower end of side walls of the first to third semiconductor chips, and a second side-fill part between the side walls of the first to third semiconductor chips and extending from the first side-fill part to an upper end of the side walls of the first to third semiconductor chips may be provided.

19 Claims, 16 Drawing Sheets

(56) References Cited

U.S. PATENT DOCUMENTS

| | | | | |
|---|---|---|---|---|
| 2010/0181667 A1* | 7/2010 | Iwase | .................. | H01L 21/56 |
| | | | | 257/E23.116 |
| 2012/0119354 A1* | 5/2012 | Tsai | .................. | H01L 23/562 |
| | | | | 257/737 |
| 2013/0200529 A1* | 8/2013 | Lin | .................. | H01L 25/0657 |
| | | | | 257/E23.116 |
| 2020/0075545 A1 | 3/2020 | Kim et al. | | |
| 2020/0185357 A1 | 6/2020 | Byun et al. | | |
| 2020/0365571 A1* | 11/2020 | Chen | .................. | H01L 23/3128 |

\* cited by examiner

SEMICONDUCTOR PACKAGE

CROSS-REFERENCE TO RELATED APPLICATION

This application is based on and claims priority under 35 U.S.C. § 119 to Korean Patent Application No. 10-2020-0173679, filed on Dec. 11, 2020, in the Korean Intellectual Property Office, the disclosure of which is incorporated by reference herein in its entirety.

BACKGROUND

The inventive concepts relate to semiconductor packages, and more particularly, to semiconductor packages including a plurality of semiconductor chips.

For a semiconductor package including a plurality of semiconductor chips, the more semiconductor chips the semiconductor package covers, the larger size the semiconductor package has. As a size of a semiconductor package becomes larger, the semiconductor package may be vulnerable to stress generated due to a mismatch of coefficients of thermal expansion among individual components constituting the semiconductor package. Such stress may cause defects such as cracks in a semiconductor package, thereby decreasing reliability of the semiconductor package.

SUMMARY

The inventive concepts provide semiconductor packages having improved reliability.

According to an aspect of the inventive concepts, a semiconductor package may include an interposer substrate, first to third semiconductor chips on the interposer substrate to face each other, an underfill part between each of the first to third semiconductor chips and the interposer substrate, a first side-fill part extending upward from a lower end of side walls of the first to third semiconductor chips, and a second side-fill part between the side walls of the first to third semiconductor chips and extending from the first side-fill part to an upper end of the side walls of the first to third semiconductor chips, wherein an upper surface of the first semiconductor chip includes a first edge facing the second semiconductor chip, a second edge facing the third semiconductor chip, and a first corner at which the first edge meets the second edge, an upper surface of the second semiconductor chip includes a third edge facing the first semiconductor chip, a fourth edge facing the third semiconductor chip, and a second corner at which the third edge meets the fourth edge, and the second side-fill part extends from the first corner of the first semiconductor chip along each of the first edge and the second edge of the first semiconductor chip and extends from the second corner of the second semiconductor chip along each of the third edge and the fourth edge of the second semiconductor chip.

According to another aspect of the inventive concepts, a semiconductor package may include a base, at least three semiconductor chips on the base to face each other and electrically connected to the base, an underfill part between the at least three semiconductor chips and the base, a first side-fill part extending upward from a lower end of side walls of the at least three semiconductor chips, and a second side-fill part between the side walls of the at least three semiconductor chips and extending from the first side-fill part to an upper end of the side walls of the at least three semiconductor chips, wherein the second side-fill part is in contact with each of the at least three semiconductor chips.

According to another aspect of the inventive concepts, a semiconductor package may include an interposer substrate, a plurality of semiconductor chips on the interposer substrate, each of the plurality of semiconductor chips including a lower surface facing the interposer substrate and an upper surface that is opposite to the lower surface, a first side-fill part filling between side walls of the plurality of semiconductor chips and extending upward from a lower end of the side walls of the plurality of semiconductor chips, and a second side-fill part between the side walls of the plurality of semiconductor chips and extending downward from an upper end of the side walls of the plurality of semiconductor chips, wherein the second side-fill part is in contact with a portion of at least one of edges of an upper surface of each of the plurality of semiconductor chips, and the first side-fill part is in contact with the other portion of the at least one of the edges of the upper surface of each of the plurality of semiconductor chips.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
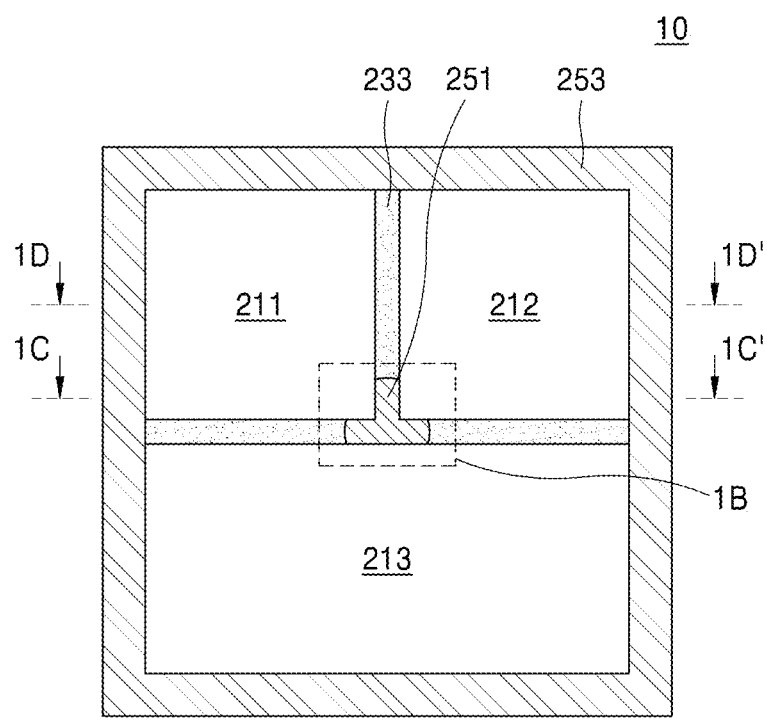
FIG. 1A is a top view of a semiconductor package according to some example embodiments of the inventive concepts.

Hereinafter, some example embodiments of the technical idea of the inventive concepts will be described in detail with reference to the accompanying drawings. Like reference numerals in the drawings denote like elements, and thus their repetitive description will be omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1B:
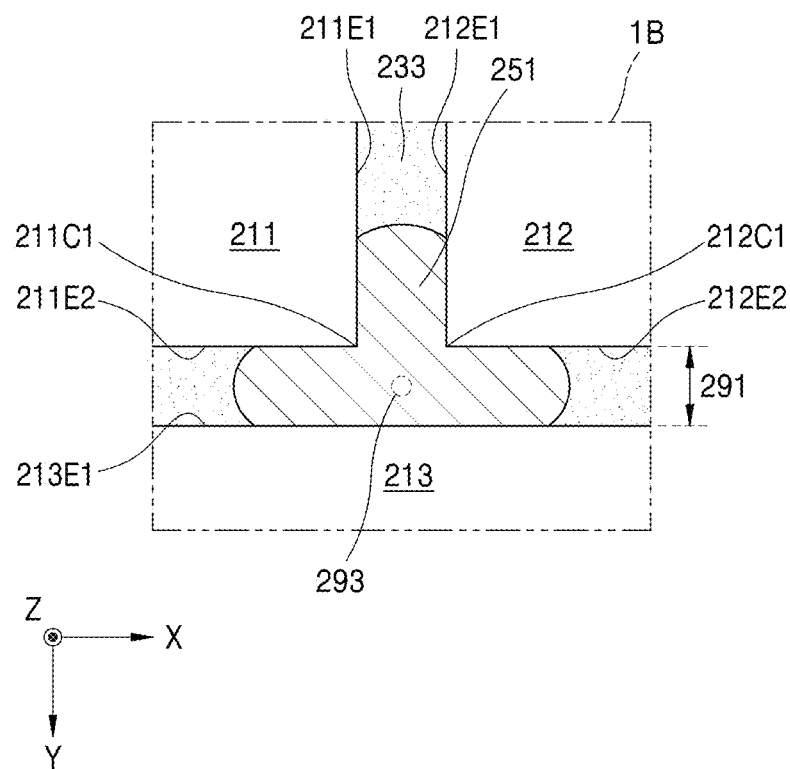
FIG. 1B is a magnified view of a region "1B" of FIG. 1A.
Figure 1C:
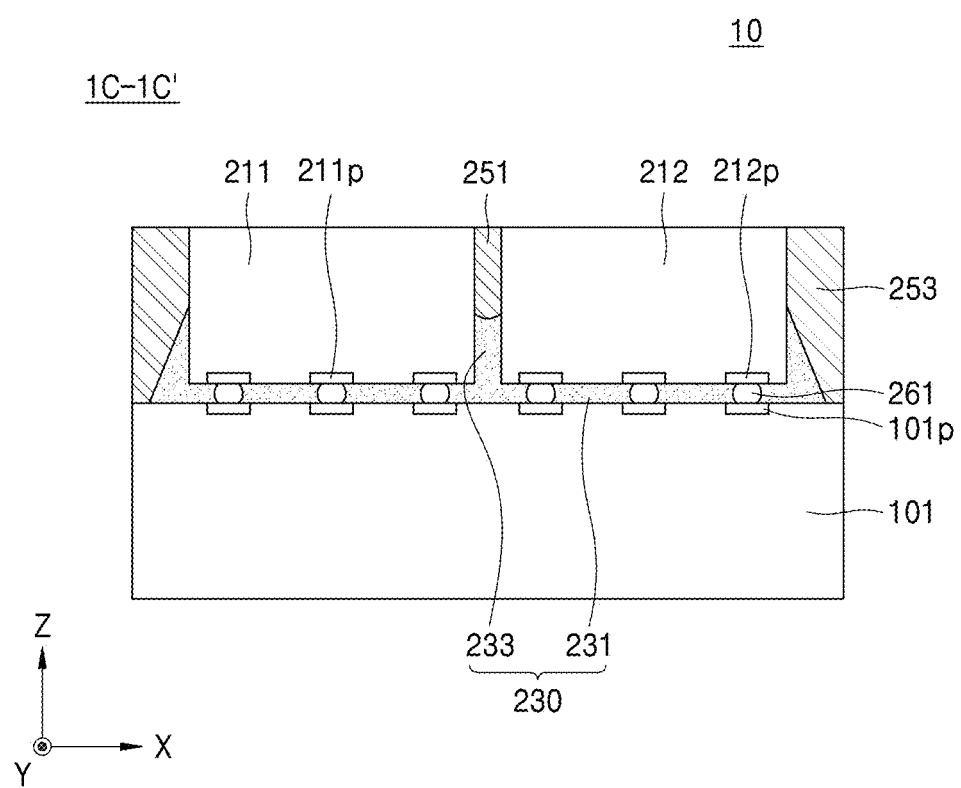
FIG. 1C is a cross-sectional view of the semiconductor package taken along line 1C-1C' of FIG. 1A.
Figure 1D:
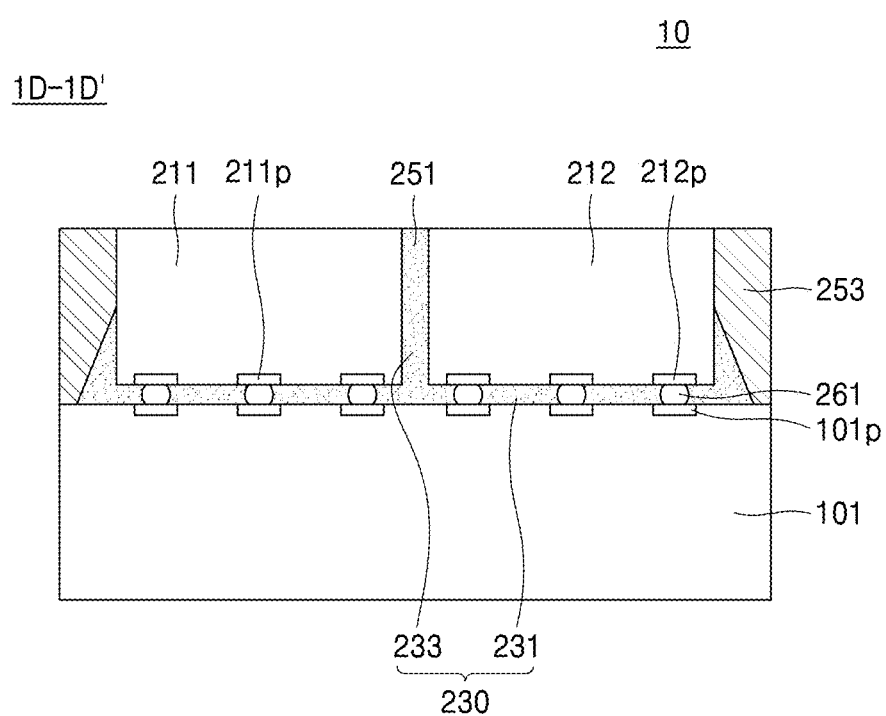
FIG. 1D is a cross-sectional view of the semiconductor package taken along line 1D-1D' of FIG. 1A.

FIG. 1A is a top view of a semiconductor package 10 according to some example embodiments of the inventive concepts. FIG. 1B is a magnified view of a region "1B" of FIG. 1A. FIG. 1C is a cross-sectional view of the semiconductor package 10 taken along line 1C-1C' of FIG. 1A; FIG. 1D is a cross-sectional view of the semiconductor package 10 taken along line 1D-1D' of FIG. 1A.

Referring to FIGS. 1A, 1B, 1C and 1D, the semiconductor package 10 may include a base 101 and a plurality of semiconductor chips on the base 101. For example, the semiconductor package 10 may include first to third semiconductor chips 211, 212, and 213 that are mounted on the base 101 and spaced apart from each other. Although FIGS. 1A to 1D shows that three semiconductor chips are mounted on the base 101, two or four or more semiconductor chips may be mounted on the base 101.

The base 101 may have a surface area in which a plurality of semiconductor chips are mounted in a plan view. The base 101 is a component constituting the semiconductor package 10 and may correspond to any one of, for example, a printed circuit board (PCB), an interposer substrate, or a semiconductor chip.

The first to third semiconductor chips 211, 212, and 213 may be arranged on an upper surface of the base 101 to be spaced apart from each other in one or more horizontal directions (an X direction and/or a Y direction). The X direction and the Y direction may be defined to be parallel to the upper surface of the base 101 and orthogonal to each other, and a Z direction may be defined to be orthogonal to the upper surface of the base 101.

Connection bumps 261 electrically connecting each of the first to third semiconductor chips 211, 212, and 213 to the base 101 may be between each of the first to third semiconductor chips 211, 212, and 213 and the base 101. The connection bumps 261 may be between connection pads 211p and 212p of the first and second semiconductor chips 211 and 212 and connection pads 101p of the base 101. Further, the connection bumps 261 may be between a connection pad of the third semiconductor chip 213 and connection pads 101p of the base 101.

Each of the first to third semiconductor chips 211, 212, and 213 may include a semiconductor substrate and a semiconductor device layer. The semiconductor substrate may include an active surface and an inactive surface that are opposite to each other. The semiconductor substrate may include silicon (Si) (e.g., crystalline silicon, polycrystalline silicon, or amorphous silicon). The semiconductor device layer may be formed on the active surface of the semiconductor substrate. Each of the plurality of semiconductor chips may include a lower surface and an upper surface that are opposite to each other. The lower surface of each semiconductor chip may be a surface adjacent to the active surface of the semiconductor substrate, and the upper surface of each semiconductor chip may be a surface adjacent to the inactive surface of the semiconductor substrate. A connection pad of each semiconductor chip may be arranged at a lower surface side of each semiconductor chip. The connection pad of each semiconductor chip may be electrically connected to individual devices of the semiconductor device layer through a wiring structure (not shown) provided to the inside of each semiconductor chip.

The first to third semiconductor chips 211, 212, and 213 may be the same type of semiconductor chips or different types of semiconductor chips. In some example embodiments, some of the first to third semiconductor chips 211, 212, and 213 may be memory chips, and the other some thereof may be logic chips.

In some example embodiments, the memory chip may include a volatile memory chip and/or a nonvolatile memory chip. The volatile memory chip may include, for example, dynamic random access memory (DRAM), static RAM (SRAM), thyristor RAM (TRAM), zero capacitor RAM (ZRAM), or twin transistor RAM (TTRAM). Further, the nonvolatile memory chip may include, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or an insulator resistance change memory.

In some example embodiments, the logic chip may include an artificial intelligence semiconductor, a microprocessor, a graphics processor, a network processor, a chipset, an audio codec, a video codec, or an application processor.

The first to third semiconductor chips 211, 212, and 213 may face each other. As shown in FIG. 1A, the first to third semiconductor chips 211, 212, and 213 may be arranged so that any one thereof faces the other two thereof. For example, the first to third semiconductor chips 211, 212, and 213 may be arranged to be spaced apart from each other so that a "T" shaped gap is formed in a top view. For example, the first and second semiconductor chips 211 and 212 may be arranged in parallel along a first edge 213E1 of the third semiconductor chip 213 that extends in the X direction, and the first semiconductor chip 211 may face the second semiconductor chip 212 in the X direction and face the third semiconductor chip 213 in the Y direction. Herein, arranging two semiconductor chips to face each other may indicate that the two semiconductor chips are adjacent to each other in the horizontal direction (the X direction and/or the Y direction) and have no other semiconductor chip therebetween.

In some example embodiments, the upper surfaces of the first to third semiconductor chips 211, 212, and 213 may be on the same plane (e.g., coplanar).

In some example embodiments, a distance between two neighboring semiconductor chips may be about 20 μm to about 200 μm in the horizontal direction (e.g., the X direction or the Y direction). In some example embodiments, a distance 291 between the first semiconductor chip 211 and the third semiconductor chip 213 may be about 20 μm to about 200 μm in the Y direction. In some example embodiments, a distance 291 between the second semiconductor chip 212 and the third semiconductor chip 213 may be about 20 μm to about 200 μm in the Y direction. In some example embodiments, a distance between the first semiconductor chip 211 and the second semiconductor chip 212 may be about 20 μm to about 200 μm in the X direction. Because the first to third semiconductor chips 211, 212, and 213 are spaced at narrow gaps of 200 μm or less, a signal path between semiconductor chips may be reduced, and the semiconductor package 10 may be reduced or miniaturized.

The semiconductor package 10 may include a first insulating filler material 230. The first insulating filler material 230 may fill between each of the first to third semiconductor chips 211, 212, and 213 and the base 101 and partially cover a side wall of each of the first to third semiconductor chips 211, 212, and 213. For example, the first insulating filler material 230 may be formed by using a capillary underfill process using an underfill material. When the first to third semiconductor chips 211, 212, and 213 may be mounted on the base 101 by using the connection bumps 261, the underfill material may be supplied between the first to third semiconductor chips 211, 212, and 213 and the base 101 to form the first insulating filler material 230. The underfill material may fill between each of the first to third semiconductor chips 211, 212, and 213 and the base 101 and partially fill a gap between the side walls of the first to third semiconductor chips 211, 212, and 213.

For example, the first insulating filler material 230 may include a base material such as an epoxy resin, and a filler contained in the base material. The filler of the first insulating filler material 230 may be an organic or inorganic filler. For example, the filler of the first insulating filler material 230 may include silica.

The first insulating filler material 230 may include an underfill part 231 between each of the first to third semiconductor chips 211, 212, and 213 and the base 101, and a first side-fill part 233 between the side walls of the first to third semiconductor chips 211, 212, and 213. The underfill part 231 and the first side-fill part 233 may include the same material and have the same material composition.

The first side-fill part 233 may extend upward from a lower end of the side wall of each of the first to third semiconductor chips 211, 212, and 213. The first side-fill part 233 may extend from the lower end of the side wall of each of the first to third semiconductor chips 211, 212, and 213 to a point where the first side-fill part 233 meets a second side-fill part 251 as shown in FIG. 1C, or extend from the lower end to an upper end of the side wall of each of the first to third semiconductor chips 211, 212, and 213 as shown in FIG. 1D.

The semiconductor package 10 may include the second side-fill part 251 arranged between the side walls of the first to third semiconductor chips 211, 212, and 213 and on the first side-fill part 233. The second side-fill part 251 may extend downward from the upper end of the side wall of each of the first to third semiconductor chips 211, 212, and 213. As shown in FIG. 1C, the second side-fill part 251 may extend from the upper end of the side wall of each of the first to third semiconductor chips 211, 212, and 213 to the first side-fill part 233.

The second side-fill part 251 may be arranged near a central point 293 of or between the first to third semiconductor chips 211, 212, and 213. The central point 293 of the first to third semiconductor chips 211, 212, and 213 may indicate a point having the same distance apart from each of the first to third semiconductor chips 211, 212, and 213 on an arbitrary plane that is parallel to the upper surface of any one of the first to third semiconductor chips 211, 212, and 213. For example, as shown in FIG. 1A, when three semiconductor chips are arranged to face each other, a distance between each of the first to third semiconductor chips 211, 212, and 213 and the central point 293 may be identical. The second side-fill part 251 may be located to include the central point 293 of the first to third semiconductor chips 211, 212, and 213 in a top view and be in contact with all of the first to third semiconductor chips 211, 212, and 213.

For example, the second side-fill part 251 may include a base material such as an epoxy resin, and a filler contained in the base material. The filler of the second side-fill part 251 may be an organic or inorganic filler. For example, the filler of the second side-fill part 251 may include silica. In some example embodiments, the second side-fill part 251 may include an epoxy mold compound (EMC).

The second side-fill part 251 may be in contact with one corner of the upper surface of at least one of the first to third semiconductor chips 211, 212, and 213. The second side-fill part 251 may be in contact with one corner of the upper surface of at least one semiconductor chip and two edges of the upper surface of the at least one semiconductor chip, the two edges defining the one corner. The second side-fill part 251 may extend from the one corner of the upper surface of the at least one semiconductor chip along each of the two edges of the upper surface of the at least one semiconductor chip. In this case, the second side-fill part 251 may be in contact with a portion of each of the two edges of the upper surface of the at least one semiconductor chip, and the first side-fill part 233 may be in contact with the other portion of each of the two edges of the upper surface of the at least one semiconductor chip.

For example, as shown in FIG. 1A and FIG. 1B, when the first and second semiconductor chips 211 and 212 are arranged in parallel along the first edge 213E1 of the third semiconductor chip 213, the second side-fill part 251 may have a "T" shape in a top view. That is, the second side-fill part 251 may have a shape extending in three directions from the central point 293.

As shown in FIG. 1B, the upper surface of the first semiconductor chip 211 may include a first edge 211E1 facing the second semiconductor chip 212, a second edge 211E2 facing the third semiconductor chip 213, and a first corner 211C1 where the first edge 211E1 meets the second edge 211E2. The upper surface of the second semiconductor chip 212 may include a third edge 212E1 facing the first semiconductor chip 211, a fourth edge 212E2 facing the third semiconductor chip 213, and a second corner 212C1 where the third edge 212E1 meets the fourth edge 212E2.

In this case, the second side-fill part 251 may be in contact with a portion of one edge of the upper surface of the first semiconductor chip 211, and the first side-fill part 233 may be in contact with the other portion of the one edge of the upper surface of the first semiconductor chip 211. For example, the second side-fill part 251 may be in contact with the first corner 211C1 of the upper surface of the first semiconductor chip 211 and in contact with a portion of the first edge 211E1 and a portion of the second edge 211E2 of the upper surface of the first semiconductor chip 211, each portion extending from the first corner 211C1. The first side-fill part 233 may be in contact with the other portion of the first edge 211E1 and the other portion of the second edge 211E2 of the upper surface of the first semiconductor chip 211.

Further, the second side-fill part 251 may be in contact with the second corner 212C1 of the upper surface of the second semiconductor chip 212 and with a portion of the third edge 212E1 and a portion of the fourth edge 212E2 of the upper surface of the second semiconductor chip 212, each portion extending from the second corner 212C1. The first side-fill part 233 may be in contact with the other portion of the third edge 212E1 and the other portion of the fourth edge 212E2 of the upper surface of the second semiconductor chip 212.

In some example embodiments, the upper surfaces of the first to third semiconductor chips 211, 212, and 213, and an upper surface of the first side-fill part 233 and an upper surface of the second side-fill part 251, which are exposed between the upper surfaces of the first to third semiconductor chips 211, 212, and 213, may be on the same plane (e.g., coplanar).

In some example embodiments, the second side-fill part 251 may have a lower coefficient of thermal expansion (CTE) than the first side-fill part 233. A difference between a CTE of each of the first to third semiconductor chips 211, 212, and 213 and a CTE of the second side-fill part 251 may be less than a difference between the CTE of each of the first to third semiconductor chips 211, 212, and 213 and a CTE of the first side-fill part 233. For example, when each semiconductor chip has a CTE of about 2 ppm/K to about 3 ppm/K, the CTE of the second side-fill part 251 may be about 5 ppm/K to about 15 ppm/K, and the CTE of the first side-fill part 233 may be about 15 ppm/K to about 30 ppm/K.

In some example embodiments, content of the filler included in the second side-fill part 251 may be greater than content of the filler included in the first side-fill part 233. For example, the filler content of the second side-fill part 251 may be about 70 wt % to about 90 wt %, and the filler content of the first side-fill part 233 may be about 50 wt % to about 70 wt %.

In some example embodiments, a particle size of the filler included in the second side-fill part 251 may be greater than a particle size of the filler included in the first side-fill part 233. For example, when the second side-fill part 251 includes silica having a particle size of about 3 μm to about 10 μm, the first side-fill part 233 may include silica having a particle size of about 1 μm to about 3 μm.

Further, the semiconductor package 10 may include a molding part 253 molding the first to third semiconductor chips 211, 212, and 213. The molding part 253 may be on the upper surface of the base 101 and laterally surround the first to third semiconductor chips 211, 212, and 213. The molding part 253 may cover side walls of the first to third semiconductor chips 211, 212, and 213 that are oriented to the outside of the semiconductor package 10. The molding part 253 may be in contact with the upper surface of the base 101 and with the first insulating filler material 230.

In some example embodiments, the molding part 253 may be formed not to cover the upper surfaces of the first to third semiconductor chips 211, 212, and 213 so that the upper surfaces of the first to third semiconductor chips 211, 212, and 213 are exposed. In some example embodiments, an upper surface of the molding part 253 may be on the same plane as (e.g., coplanar with) the upper surfaces of the first to third semiconductor chips 211, 212, and 213.

In some example embodiments, the molding part 253 may include the same material as the second side-fill part 251 and have the same material composition as the second side-fill part 251. For example, the molding part 253 may include an EMC. For example, the molding part 253 and the second side-fill part 251 may be formed together by the same molding process.

For example, in a region in which three or more semiconductor chips meet in the semiconductor package 10, stress due to a CTE difference is relatively large, and cracks easily occur due to this stress at an upper part of the region in which the three or more semiconductor chips meet. These cracks may extend downward, thereby causing damage to the base 101, damage to the connection bumps 261, and the like. However, according to some example embodiments of the inventive concepts, the second side-fill part 251 having a relatively low CTE characteristic is arranged on the upper part of the region in which the three or more semiconductor chips meet, and thus, stress due to a CTE difference may be reduced, and the occurrence of cracks may be mitigated or prevented. Accordingly, defects of the semiconductor package 10 due to cracks may be mitigated or prevented, thereby improving reliability of the semiconductor package 10.

Figure 2A:
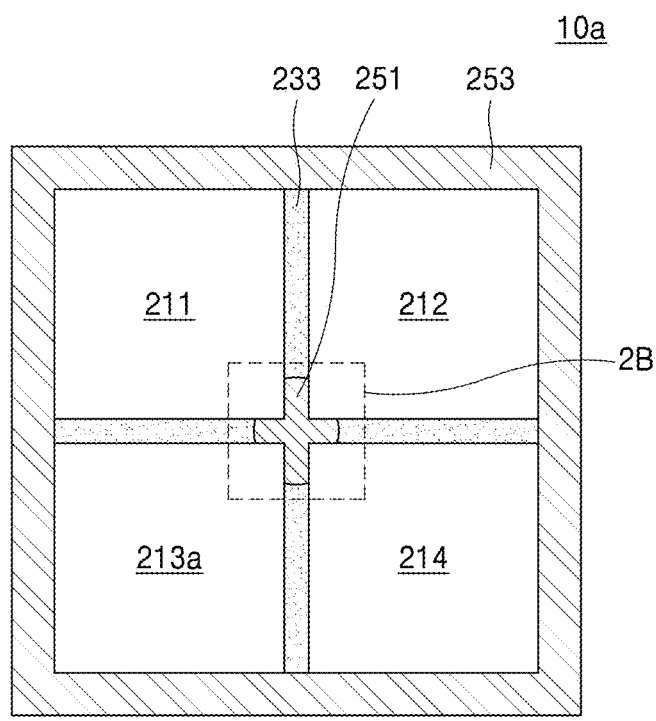
FIG. 2A is a top view of a semiconductor package according to some example embodiments of the inventive concepts.
Figure 2A:
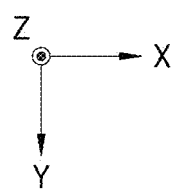
Figure 2B:
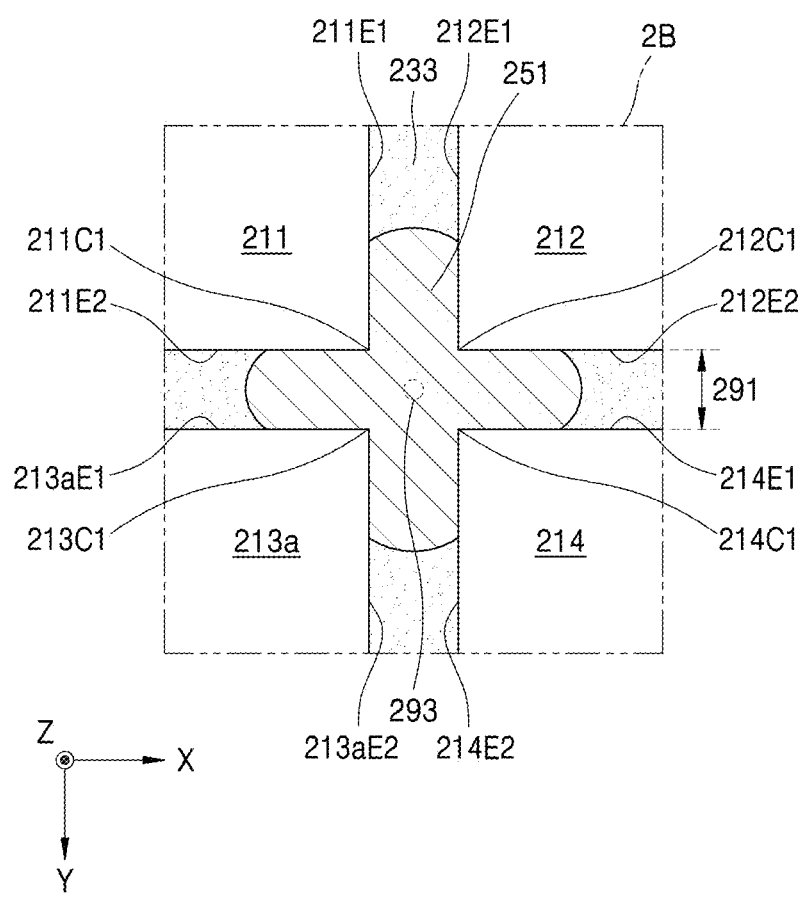
FIG. 2B is a magnified view of a region "2B" of FIG. 2A.

FIG. 2A is a top view of a semiconductor package 10a according to some example embodiments of the inventive concepts. FIG. 2B is a magnified view of a region "2B" of FIG. 2A. Hereinafter, the semiconductor package 10a shown in FIGS. 2A and 2B will be described based on differences from the semiconductor package 10 described with reference to FIGS. 1A to 1D.

Referring to FIGS. 2A and 2B, the semiconductor package 10a may include first to fourth semiconductor chips 211, 212, 213a, and 214 arranged on the base (101 of FIG. 1C) to face each other. For example, the first to fourth semiconductor chips 211, 212, 213a, and 214 may be arranged in a quadrangular or lattice shape. The first to fourth semiconductor chips 211, 212, 213a, and 214 may be arranged to be apart from each other so that a cross-shaped gap is formed therebetween in a top view. For example, the first semiconductor chip 211 may face the second semiconductor chip 212 in the X direction, face the third semiconductor chip 213a in the Y direction, and face the fourth semiconductor chip 214 in a diagonal direction intersecting with both the X and Y directions.

The second side-fill part 251 may be arranged near the central point 293 of the first to fourth semiconductor chips 211, 212, 213a, and 214. The central point 293 of the first to fourth semiconductor chips 211, 212, 213a, and 214 may indicate a point having the same distance apart from each of the first to fourth semiconductor chips 211, 212, 213a, and 214 on an arbitrary plane that is parallel to an upper surface of any one of the first to fourth semiconductor chips 211, 212, 213a, and 214. For example, the second side-fill part 251 may be located to include the central point 293 of the first to fourth semiconductor chips 211, 212, 213a, and 214 in a top view and be in contact with all of the first to fourth semiconductor chips 211, 212, 213a, and 214.

The second side-fill part 251 may have a cross shape in a top view. That is, the second side-fill part 251 may have a shape extending in four directions from the central point 293 of the first to fourth semiconductor chips 211, 212, 213a, and 214.

As shown in FIG. 2B, the upper surface of the first semiconductor chip 211 may include the first edge 211E1 facing the second semiconductor chip 212, the second edge 211E2 facing the third semiconductor chip 213a, and the first corner 211C1 where the first edge 211E1 meets the second edge 211E2. The upper surface of the second semiconductor chip 212 may include the third edge 212E1 facing the first semiconductor chip 211, the fourth edge 212E2 facing the fourth semiconductor chip 214, and the second corner 212C1 where the third edge 212E1 meets the fourth edge 212E2. An upper surface of the third semiconductor chip 213a may include a fifth edge 213aE1 facing the first semiconductor chip 211, a sixth edge 213aE2 facing the fourth semiconductor chip 214, and a third corner 213C1 where the fifth edge 213aE1 meets the sixth edge 213aE2. An upper surface of the fourth semiconductor chip 214 may include a seventh edge 214E1 facing the second semiconductor chip 212, an eighth edge 214E2 facing the third semiconductor chip 213a, and a fourth corner 214C1 where the seventh edge 214E1 meets the eighth edge 214E2.

In this case, the second side-fill part 251 may be in contact with a portion of the first edge 211E1 and a portion of the second edge 211E2 of the upper surface of the first semiconductor chip 211, each portion extending from the first corner 211C1, and the first side-fill part 233 may be in contact with the other portion of the first edge 211E1 and the other portion of the second edge 211E2 of the upper surface of the first semiconductor chip 211. Further, the second side-fill part 251 may be in contact with a portion of the third edge 212E1 and a portion of the fourth edge 212E2 of the upper surface of the second semiconductor chip 212, each portion extending from the second corner 212C1, and the first side-fill part 233 may be in contact with the other portion of the third edge 212E1 and the other portion of the fourth edge 212E2 of the upper surface of the second semiconductor chip 212. Further, the second side-fill part 251 may be in contact with a portion of the fifth edge 213aE1 and a portion of the sixth edge 213aE2 of the upper surface of the third semiconductor chip 213a, each portion extending from the third corner 213C1, and the first side-fill part 233 may be in contact with the other portion of the fifth edge 213aE1 and the other portion of the sixth edge 213aE2 of the upper surface of the third semiconductor chip 213a. Further, the second side-fill part 251 may be in contact with a portion of the seventh edge 214E1 and a portion of the eighth edge 214E2 of the upper surface of the fourth semiconductor chip 214, each portion extending from the fourth corner 214C1, and the first side-fill part 233 may be in contact with the other portion of the seventh edge 214E1 and the other portion of the eighth edge 214E2 of the upper surface of the fourth semiconductor chip 214.

Figure 3:
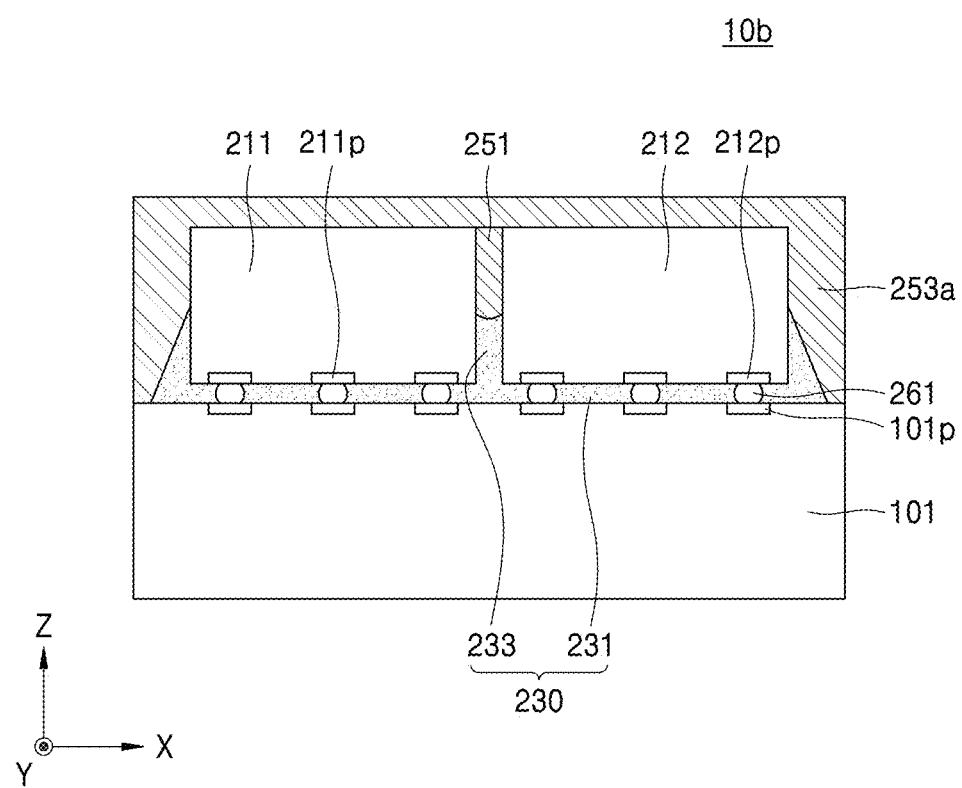
FIG. 3 is a cross-sectional view of a semiconductor package according to some example embodiments of the inventive concepts.

FIG. 3 is a cross-sectional view of a semiconductor package 10b according to some example embodiments of the inventive concepts.

The semiconductor package 10b shown in FIG. 3 may be the same as or substantially similar to the semiconductor package 10 described with reference to FIGS. 1A to 1D except for a molding part 253a. Hereinafter, the semiconductor package 10b shown in FIG. 3 will be described based on differences from the semiconductor package 10 described with reference to FIGS. 1A to 1D.

Referring to FIGS. 1A and 3, the molding part 253a may cover the upper surfaces of the first to third semiconductor chips 211, 212, and 213. The molding part 253a may extend along the upper surfaces of the first to third semiconductor chips 211, 212, and 213. The molding part 253a may be connected to the second side-fill part 251. The molding part 253a may be formed together by the same molding process as that of the second side-fill part 251. For example, in some example embodiments, the molding part 253a may include the same material as the second side-fill part 251 and have the same material composition as the second side-fill part 251.

Figure 4A:
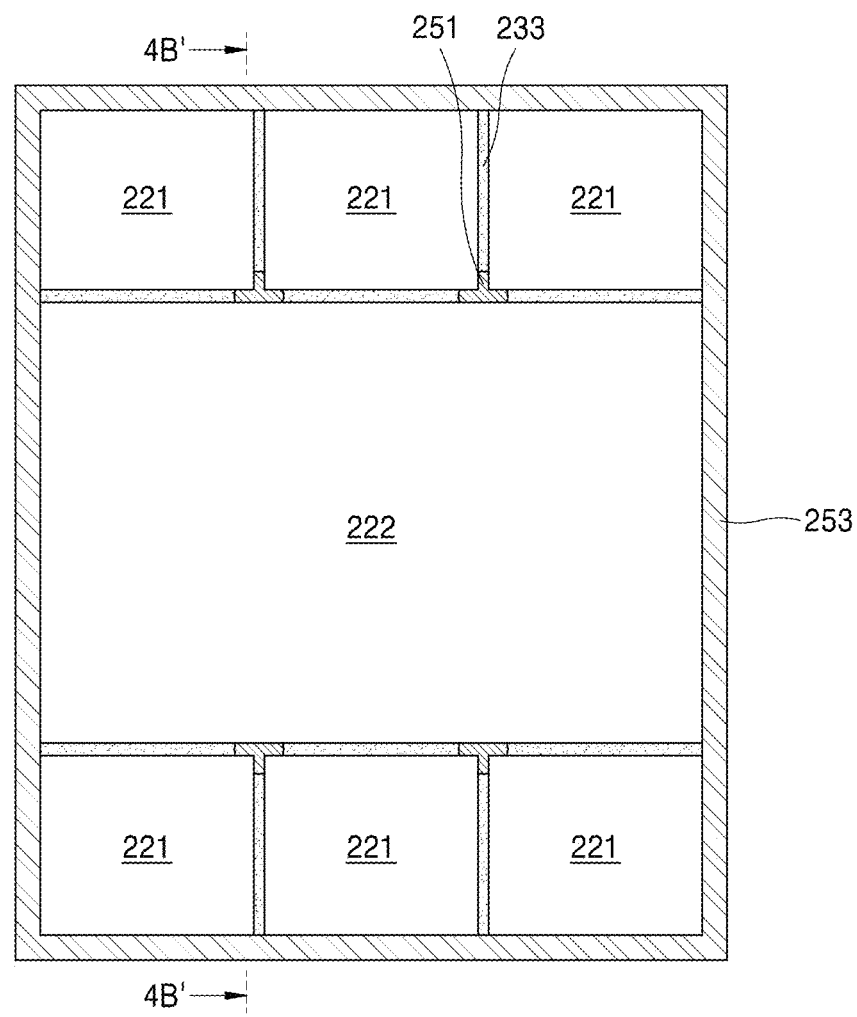
FIG. 4A is a top view of a semiconductor package according to some example embodiments of the inventive concepts.
Figure 4B:
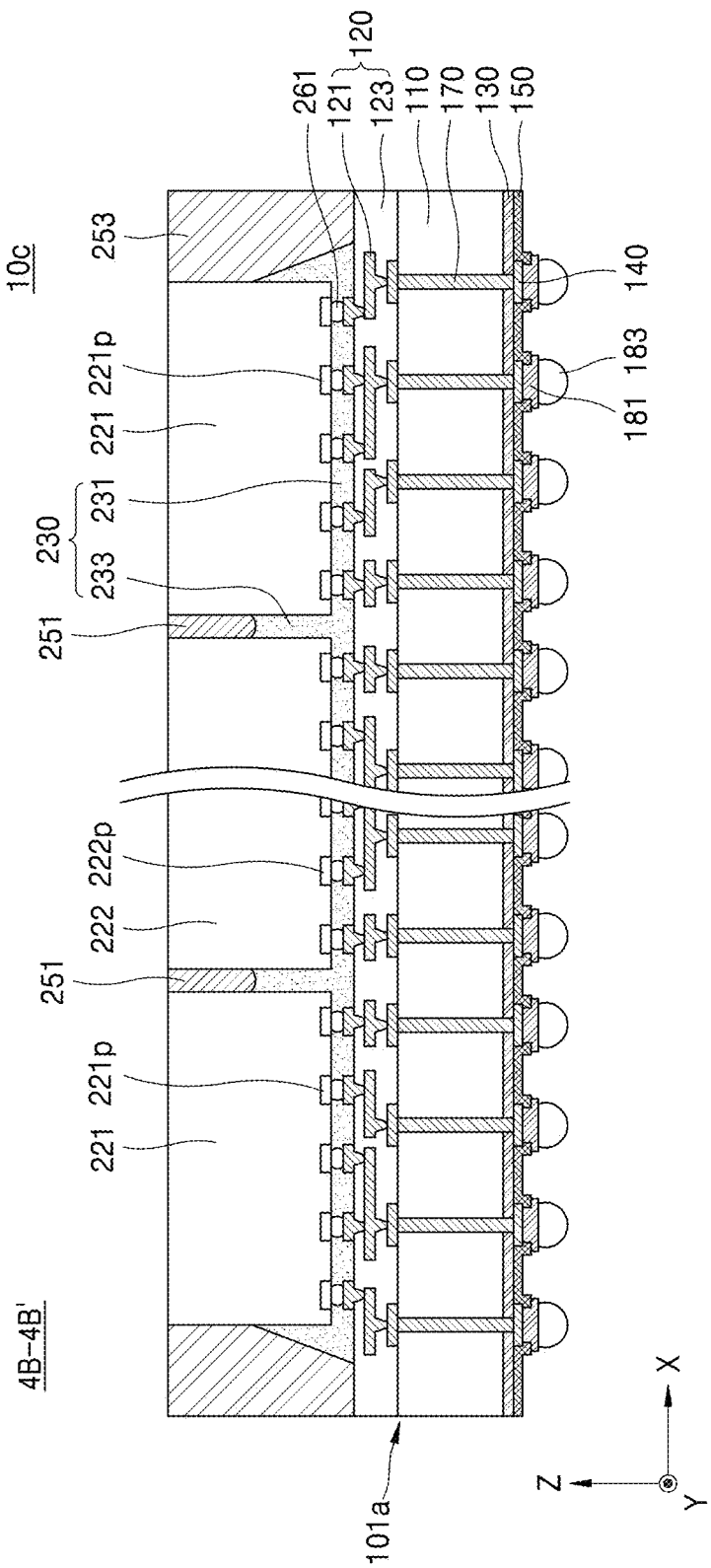
FIG. 4B is a cross-sectional view taken along line 4B-4B' of FIG. 4A.

FIG. 4A is a top view of a semiconductor package 10c according to example embodiments of the inventive concepts. FIG. 4B is a cross-sectional view taken along line 4B-4B' of FIG. 4A. Hereinafter, the semiconductor package 10c shown in FIGS. 4A and 4B will be described based on differences from the semiconductor package 10 described with reference to FIGS. 1A to 1D.

Referring to FIGS. 4A and 4B, the semiconductor package 10c may include an interposer substrate 101a, a plurality of semiconductor chips 221 and 222, the first insulating filler material 230, the second side-fill part 251, and the molding part 253.

The interposer substrate 101a may include a base layer 110, a redistribution structure 120, a first lower protective layer 130, a lower conductive pad 140, a second lower protective layer 150, and a through electrode 170.

The base layer 110 may include a semiconductor material, glass, ceramics, or plastic. In some example embodiments, the base layer 110 may include a silicon wafer including Si (e.g., crystalline silicon, polycrystalline silicon, or amorphous silicon). The base layer 110 may have a flat plate shape and include an upper surface and a lower surface that are opposite to each other.

The redistribution structure 120 may be on the upper surface of the base layer 110. The redistribution structure 120 may include an insulating layer 123 covering the upper surface of the base layer 110, and a conductive redistribution pattern 121 surrounded by the insulating layer 123. For example, the redistribution structure 120 may include a back-end-of-line (BEOL) structure.

In some example embodiments, the insulating layer 123 may include an inorganic insulating material. For example, the insulating layer 123 may include at least one of oxides or nitrides. For example, the insulating layer 123 may include at least one of silicon oxides or silicon nitrides. In some example embodiments, the insulating layer 123 may include an organic insulating material. For example, the insulating layer 123 may include a photo imagable dielectric (PID) such as polyimide (PI).

The conductive redistribution pattern 121 may include a plurality of conductive layers located in different levels in the insulating layer 123 to form a multi-layer structure, and conductive vias extending in a vertical direction in the insulating layer 123 to connect the plurality of conductive layers to each other. For example, the conductive redistribution pattern 121 may include at least one metal selected from among tungsten (W), aluminum (Al), and copper (Cu).

The conductive redistribution pattern 121 may include a pad disposed on an upper surface of the insulating layer 123. The pad of the conductive redistribution pattern 121 may be connected to the connection bump 261 arranged between the pad of the conductive redistribution pattern 121 and each of the plurality of semiconductor chips 221 and 222. The connection bump 261 may electrically and physically connect each of the plurality of semiconductor chips 221 and 222 to the interposer substrate 101a.

The first lower protective layer 130 may cover the lower surface of the base layer 110. Further, the first lower protective layer 130 may cover a side wall of the through electrode 170 protruding from the lower surface of the base layer 110. In some example embodiments, a lower surface of the first lower protective layer 130 may be on the same plane as (e.g., coplanar with) a lower surface of the through electrode 170 in contact with the lower conductive pad 140.

In some example embodiments, the first lower protective layer 130 may include an inorganic insulating material. For example, the first lower protective layer 130 may include at least one of oxides or nitrides. For example, the first lower protective layer 130 may include at least one of silicon oxides or silicon nitrides.

In some example embodiments, the first lower protective layer 130 may have a multi-layer structure in which a plurality of insulating layers are stacked. For example, the first lower protective layer 130 may include first and second layers sequentially stacked on the lower surface of the base layer 110. In some example embodiments, the first layer of the first lower protective layer 130 may be formed of a silicon oxide, which has a relatively good adhesive strength. In this case, an adhesive strength between the first lower protective layer 130 and the base layer 110 may be increased. Further, in some example embodiments, the second layer of the first lower protective layer 130 may be formed of a silicon nitride.

The lower conductive pad 140 may be on the lower surface of the first lower protective layer 130. For example, the lower conductive pad 140 may be a pad connected to a board-interposer connection bump 183. A plurality of lower conductive pads 140 may be arranged on the lower surface of the first lower protective layer 130 to be apart from each other in the horizontal direction (e.g., the X direction or the Y direction). For example, lower conductive pads 140 may be arranged in a two-dimensional array form on the lower surface of the first lower protective layer 130. The lower conductive pad 140 may have a polygonal shape (e.g., a quadrangular or hexagonal shape) in a plan view. In some example embodiments, the lower conductive pad 140 may have a circular or oval shape in a plan view. The lower conductive pad 140 may include at least one metal selected from among W, Al, and Cu.

In some example embodiments, the lower conductive pad 140 may have a uniform thickness. When the lower conductive pad 140 has an upper surface in contact with the first lower protective layer 130 and the through electrode 170 and a lower surface that is opposite to the lower surface, the upper and lower surfaces of the lower conductive pad 140 may be flat.

The second lower protective layer 150 may cover the lower surface of the first lower protective layer 130 and cover a portion of the lower conductive pad 140. The second lower protective layer 150 may include an opening configured to open a portion of the lower surface of the lower conductive pad 140. Through the opening of the second lower protective layer 150, the board-interposer connection bump 183 may be connected to the lower conductive pad 140.

In some example embodiments, the second lower protective layer 150 may be formed of a material that is different from a material forming the first lower protective layer 130. The first lower protective layer 130 may be formed of an inorganic insulating material, and the second lower protective layer 150 may be formed of an organic insulating material. In some example embodiments, the second lower protective layer 150 may include a PID. For example, the second lower protective layer 150 may include PI or polybenzoxazole (PBO). In other example embodiments, the second lower protective layer 150 may be formed of an inorganic insulating material.

The interposer substrate 101a may include a lower connection pillar 181 on the lower conductive pad 140. The lower connection pillar 181 may be connected to the lower conductive pad 140 through the opening of the second lower protective layer 150 and be in contact with a portion of the second lower protective layer 150 covering an edge part of the lower surface of the lower conductive pad 140. The lower connection pillar 181 may function as an under bump metallurgy. The lower connection pillar 181 may include nickel (Ni), Cu, palladium (Pd), platinum (Pt), gold (Au), or a combination thereof. In accordance with circumstances, the lower connection pillar 181 may be omitted.

The board-interposer connection bump 183 connecting the interposer substrate 101a to a board such as a PCB may be attached to the lower connection pillar 181. The board-interposer connection bump 183 may have a greater width than the connection bump 261.

The through electrode 170 may be formed to electrically connect the conductive redistribution pattern 121 of the redistribution structure 120 to the lower conductive pad 140. The through electrode 170 may extend from the upper surface to the lower surface of the base layer 110 to pass through the base layer 110 in the vertical direction. Further, the through electrode 170 may further pass through the first lower protective layer 130 on the lower surface of the base layer 110. An upper end of the through electrode 170 may be connected to the conductive redistribution pattern 121 of the redistribution structure 120, and a lower end of the through electrode 170 may be connected to the lower conductive pad 140.

For example, the through electrode 170 may include a pillar-shaped conductive plug passing through the base layer 110 and the first lower protective layer 130, and a cylindrical conductive barrier layer surrounding a side wall of the conductive plug. The conductive barrier layer may include at least one material selected from among titanium (Ti), a titanium nitride (TiN), tantalum (Ta), a tantalum nitride (TaN), ruthenium (Ru), cobalt (Co), manganese (Mn), a tungsten nitride (WN), Ni, and nickel boron (NiB), and the conductive plug may include at least one material selected from among Cu, a Cu alloy such as copper tin (CuSn), copper magnesium (CuMg), CuNi, copper zinc (CuZn), CuPd, CuAu, copper rhenium (CuRe), CuW, W, a W alloy, Ni, Ru, and Co. A via insulating layer may be between the base layer 110 and the through electrode 170. The via insulating layer may include an oxide layer, a nitride layer, a carbide layer, a polymer, or a combination thereof. In some example embodiments, an aspect ratio of the through electrode 170 (e.g., a ratio of a height of the through electrode 170 in the vertical direction (e.g., the Z direction) to a width of the through electrode 170 in the horizontal direction (e.g., the X direction) may be about 7 to about 9.

The plurality of semiconductor chips 221 and 222 may be mounted on the interposer substrate 101a. The plurality of semiconductor chips 221 and 222 may be mounted on the redistribution structure 120 of the interposer substrate 101a to be spaced apart from each other in the horizontal direction (the X direction and/or the Y direction). The plurality of semiconductor chips 221 and 222 may be mounted on the interposer substrate 101a in a flip-chip manner. That is, the plurality of semiconductor chips 221 and 222 may be mounted on the interposer substrate 101a so that surfaces thereof, on which chip pads 221p and 222p are provided, face the interposer substrate 101a. The chip pads 221p and 222p of the plurality of semiconductor chips 221 and 222 may be electrically connected to the conductive redistribution pattern 121 through the connection bumps 261. The chip pads 221p and 222p of the plurality of semiconductor chips 221 and 222 may be used as terminals for input/output data signal transmission or terminals for power and/or the ground.

In some example embodiments, one of the plurality of semiconductor chips 221 and 222 may be a logic chip 222, and the others of the plurality of semiconductor chips 221 and 222 may be memory chips 221. The logic chip 222 and the memory chips 221 may be electrically connected to each other through the interposer substrate 101a.

For example, the semiconductor package 10c may include the logic chip 222 located at an approximate center of the interposer substrate 101a, and the memory chips 221 extending along two opposite side parts of the logic chip 222. For example, as shown in FIG. 4A, a surface area of the logic chip 222 may be greater than a surface area of each of the memory chips 221, and three memory chips 221 may be arranged along one side part of the logic chip 222 in a plane view.

The first insulating filler material 230 may include the underfill part 231 between the plurality of semiconductor chips 221 and 222 and the interposer substrate 101a, and the first side-fill part 233 between side walls of the plurality of semiconductor chips 221 and 222. The first side-fill part 233 may fill between a side wall of the logic chip 222 and side walls of the memory chips 221 and fill between side walls of neighboring memory chips 221.

The second side-fill part 251 may be arranged near a central point between at least three semiconductor chips, among the plurality of semiconductor chips 221 and 222, that face each other and be in contact with all of the at least three semiconductor chips. For example, the second side-fill part 251 may be between the logic chip 222 and two neighboring memory chips 221.

Figure 5:
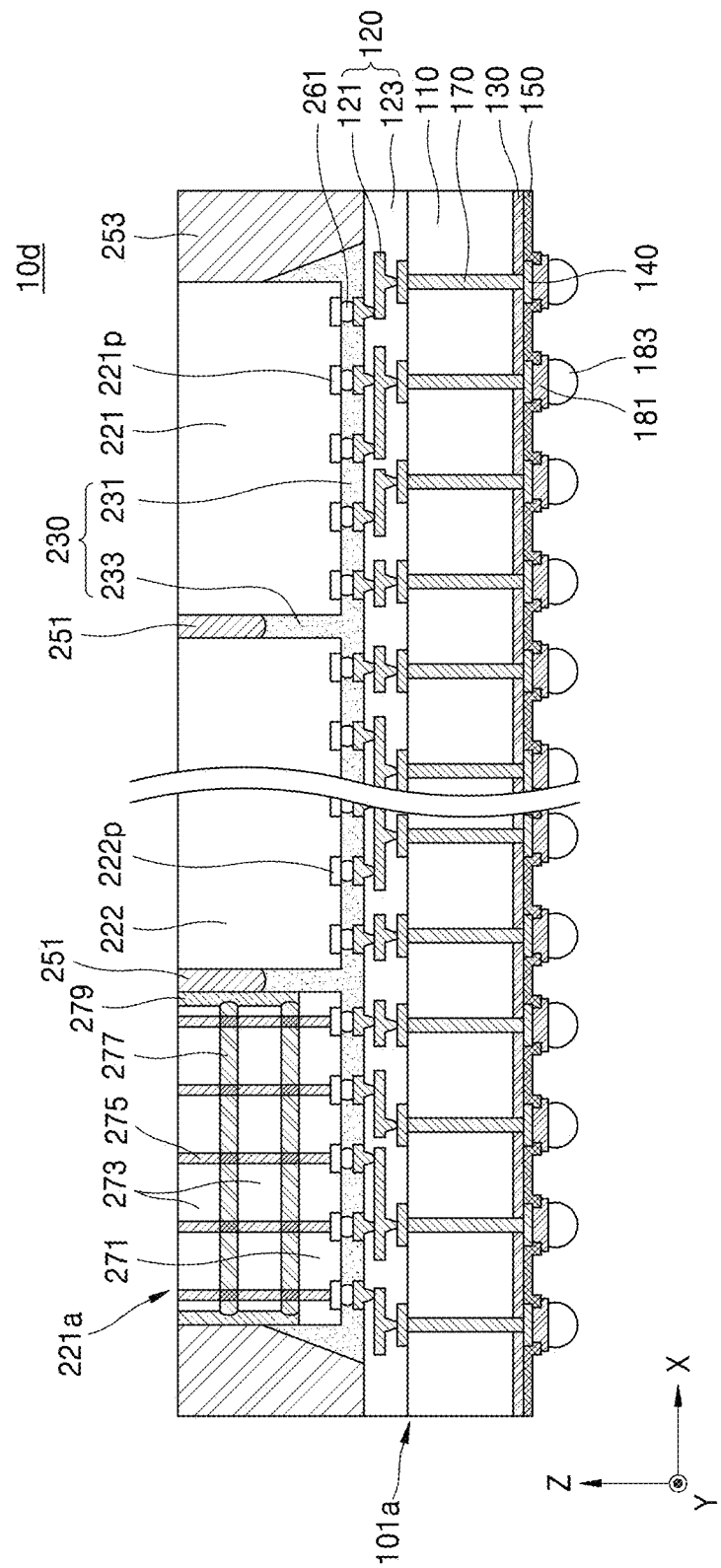
FIG. 5 is a cross-sectional view of a semiconductor package according to some example embodiments of the inventive concepts.

FIG. 5 is a cross-sectional view of a semiconductor package 10d according to some example embodiments of the inventive concepts. Hereinafter, the semiconductor package 10d shown in FIG. 5 will be described based on differences from the semiconductor package 10c described with reference to FIGS. 4A and 4B.

Referring to FIGS. 4A and 5, the semiconductor package 10d may include a stacked semiconductor chip 221a. In some example embodiments, the stacked semiconductor chip 221a may be a stacked memory device. For example, the stacked semiconductor chip 221a may include a buffer die 271 and a plurality of core dies 273. For example, the buffer die 271 may be referred to as an interface die, a base die, a logic die, a master die, or the like, and each of the core dies 273 may be referred to as a memory die, a slave die, or the like. Although FIG. 5 shows that the stacked semiconductor chip 221a includes two core dies 273, the number of core dies 273 may be variously changed. For example, the stacked semiconductor chip 221a may include four, eight, twelve, or sixteen core dies 273.

The buffer die 271 and the core dies 273 may include a silicon through electrode (e.g., a through silicon via (TSV)) 275. The buffer die 271 and the core dies 273 may be stacked and electrically connected to each other through the TSV 275. Accordingly, the stacked semiconductor chip 221a may have a three-dimensional memory structure in which a plurality of dies are stacked. For example, the stacked semiconductor chip 221a may be implemented based on the high bandwidth memory (HBM) or hybrid memory cube (HMC) standard.

Each of the core dies 273 may include a memory cell array. The buffer die 271 may include a physical layer and a direct access region. The physical layer of the buffer die 271 may include interface circuits for communication with an external host device and be electrically connected to the logic chip 222 through the interposer substrate 101a. Through the physical layer, the stacked semiconductor chip 221a may receive signals from the logic chip 222 or transmit signals to the logic chip 222. Signals and/or data received through the physical layer of the buffer die 271 may be transferred to the core dies 273 through TSVs 275. The direct access region may provide an access path to test the stacked semiconductor chip 221a without passing through the logic chip 222. The direct access region may include a conductive means (e.g., a port or a pin) capable of directly communicating with an external test device.

An insulating adhesive layer 277 may be between the buffer die 271 and the core die 273 or between the core dies 273. The insulating adhesive layer 277 may include, for example, a non-conductive film (NCF), a non-conductive paste (NCP), an insulating polymer, or an epoxy resin. The stacked semiconductor chip 221a may further include a molding layer 279 covering a side surface of the buffer die 271 and side surfaces of the core dies 273. The molding layer 279 may include, for example, an EMC.

The stacked semiconductor chip 221a may be electrically connected to the logic chip 222 through the interposer substrate 101a. In this case, the logic chip 222 may execute applications supported by the semiconductor package 10d, by using the stacked semiconductor chip 221a. For example, the logic chip 222 may execute specialized operations by including at least one processor among a central processing unit (CPU), an application processor (AP), a graphics processing unit (GPU), a neural processing unit (NPU), a tensor processing unit (TPU), a vision processing unit (VPU), an image signal processor (ISP), and a digital signal processor (DSP). The logic chip 222 may include a physical layer and a memory controller. The physical layer of the logic chip 222 may include input and output circuits configured to transmit and receive signals to and from the physical layer of the stacked semiconductor chip 221a. The logic chip 222 may provide various signals to the physical layer of the stacked semiconductor chip 221a through the physical layer of the logic chip 222. The memory controller of the logic chip 222 may control an operation of the stacked semiconductor chip 221a. The memory controller of the logic chip 222 may transmit signals for controlling the stacked semiconductor chip 221a to the stacked semiconductor chip 221a through the conductive redistribution pattern 121 of the interposer substrate 101a.

Figure 6:
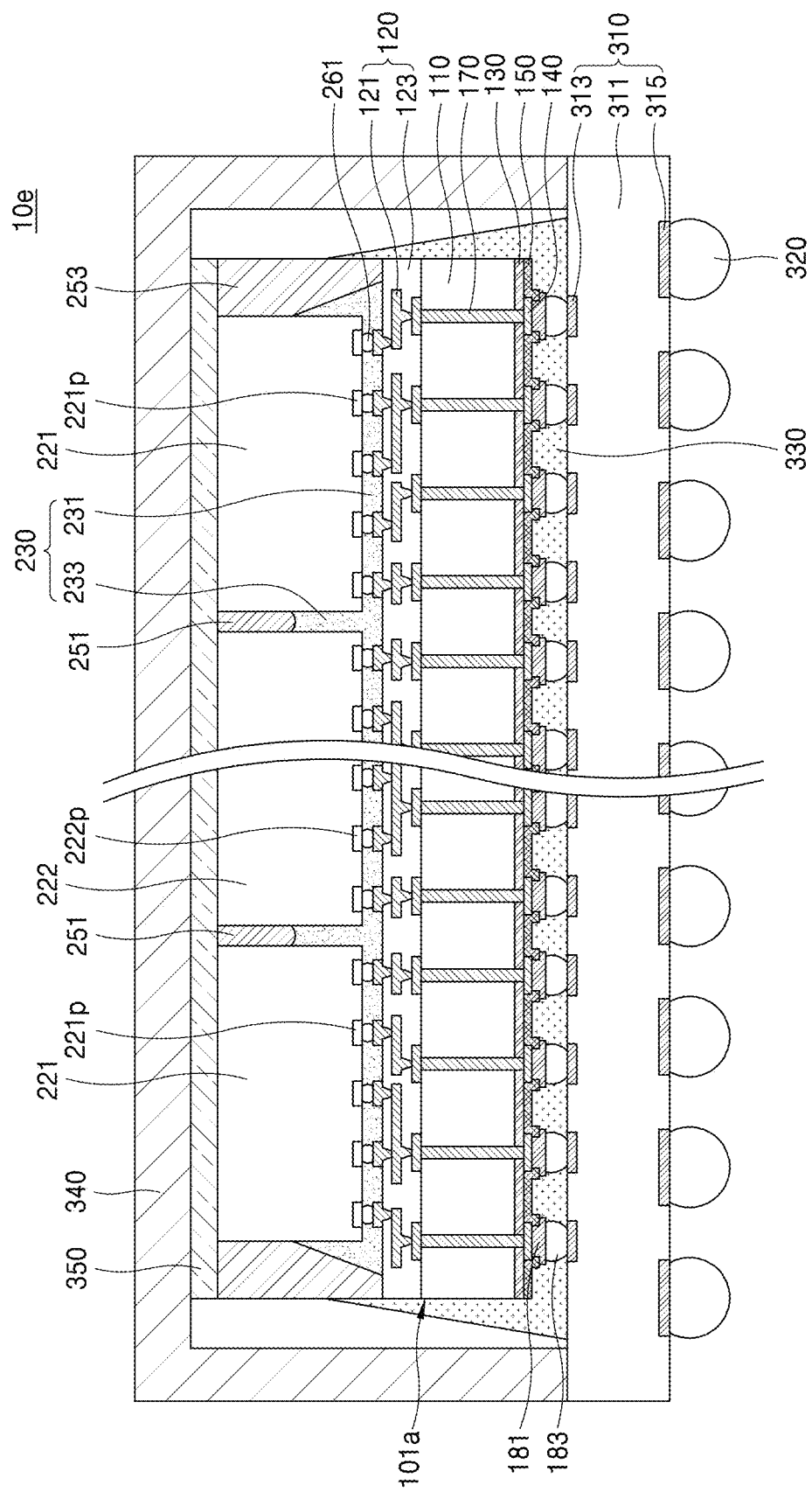
FIG. 6 is a cross-sectional view of a semiconductor package according to some example embodiments of the inventive concepts.

FIG. 6 is a cross-sectional view of a semiconductor package 10e according to some example embodiments of the inventive concepts. Hereinafter, the semiconductor package 10e shown in FIG. 6 will be described based on differences from the semiconductor package 10c described with reference to FIGS. 4A and 4B.

Referring to FIG. 6, the semiconductor package 10e may include a package substrate 310 on which the interposer substrate 101a is mounted. The package substrate 310 may be electrically connected to the interposer substrate 101a through the board-interposer connection bump 183. The package substrate 310 may include a substrate base 311, and a substrate upper pad 313 and a substrate lower pad 315 on upper and lower surfaces of the substrate base 311, respectively. In some example embodiments, the package substrate 310 may be a PCB. For example, the package substrate 310 may be a multi-layer PCB. The substrate base 311 may include at least one material selected from among a phenol resin, an epoxy resin, and PI. The board-interposer connection bump 183 may be connected to the substrate upper pad 313, and an external connection terminal 320 that is formed to electrically connect an external device to the semiconductor package 10e may be connected to the substrate lower pad 315.

The semiconductor package 10e may include a second insulating filler material 330 between the interposer substrate 101a and the package substrate 310. The second insulating filler material 330 may fill a gap between the interposer substrate 101a and the package substrate 310 and surround the board-interposer connection bumps 183. Further, the second insulating filler material 330 may be in contact with a side wall of the interposer substrate 101a and a side wall of the molding part 253. The second insulating filler material 330 may extend along the side wall of the interposer substrate 101a and the side wall of the molding part 253, cover at least a portion of the side wall of the interposer substrate 101a, and cover a portion of the side wall of the molding part 253. For example, the second insulating filler material 330 may be formed by a capillary underfill process.

The semiconductor package 10e may further include a heat-dissipating member 340 covering the upper surfaces of the plurality of semiconductor chips 221 and 222. The heat-dissipating member 340 may include a heat-dissipating plate such as a heat slug or a heat sink. In some example embodiments, the heat-dissipating member 340 may be attached to an upper surface of the package substrate 310 and surround the side wall of the interposer substrate 101a and the side walls of the plurality of semiconductor chips 221 and 222. Further, the semiconductor package 10e may further include a thermal interface material 350. The thermal interface material 350 may be between the heat-dissipating member 340 and the upper surfaces of the plurality of semiconductor chips 221 and 222.

FIGS. 7A to 7E are cross-sectional views of a method of manufacturing a semiconductor package, according to some example embodiments of the inventive concepts. Hereinafter, a method of manufacturing the semiconductor package 10e shown in FIG. 6 will be described with reference to FIGS. 7A to 7E.

Figure 7A:
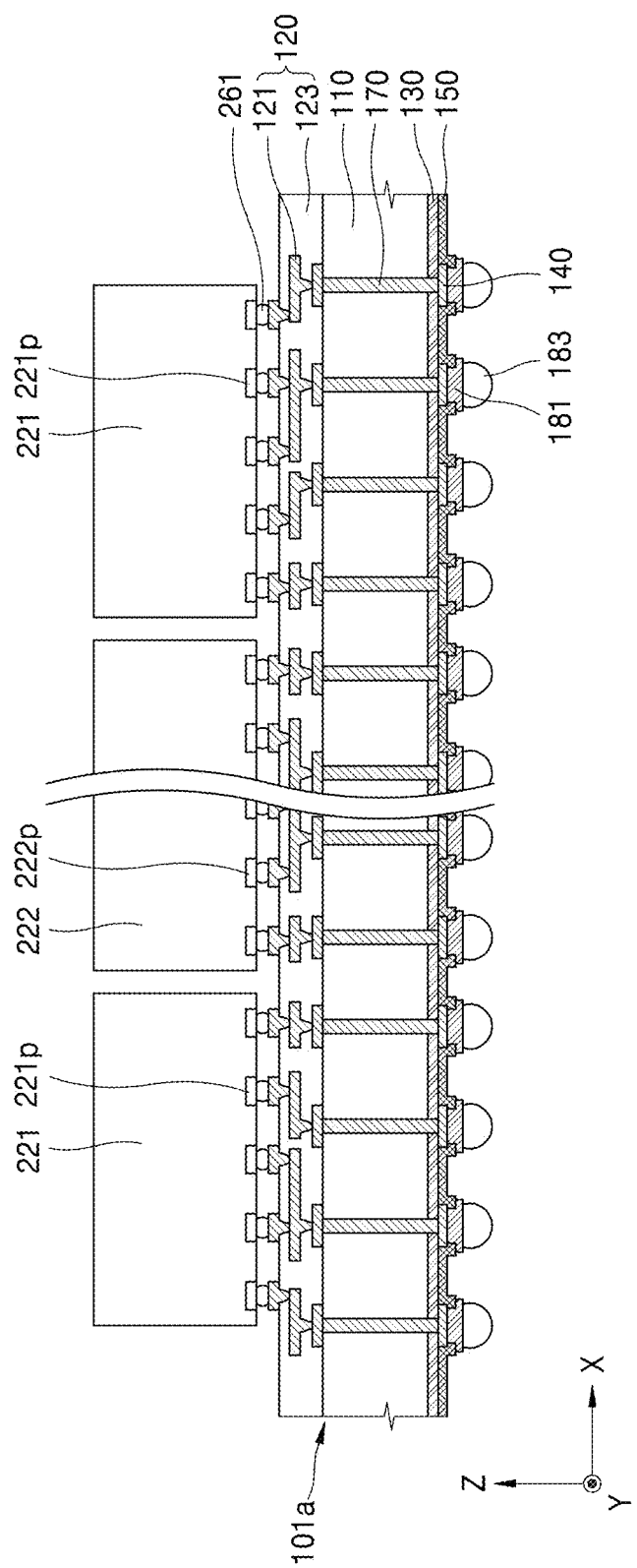
FIGS. 7A to 7E are cross-sectional views of a method of manufacturing a semiconductor package, according to some example embodiments of the inventive concepts.

Referring to FIG. 7A, the plurality of semiconductor chips 221 and 222 are mounted on the interposer substrate 101a. The plurality of semiconductor chips 221 and 222 may be mounted on the interposer substrate 101a in a flip-chip manner. In this case, a horizontal gap between two neighboring semiconductor chips may be about 200 µm or less.

Figure 7B:
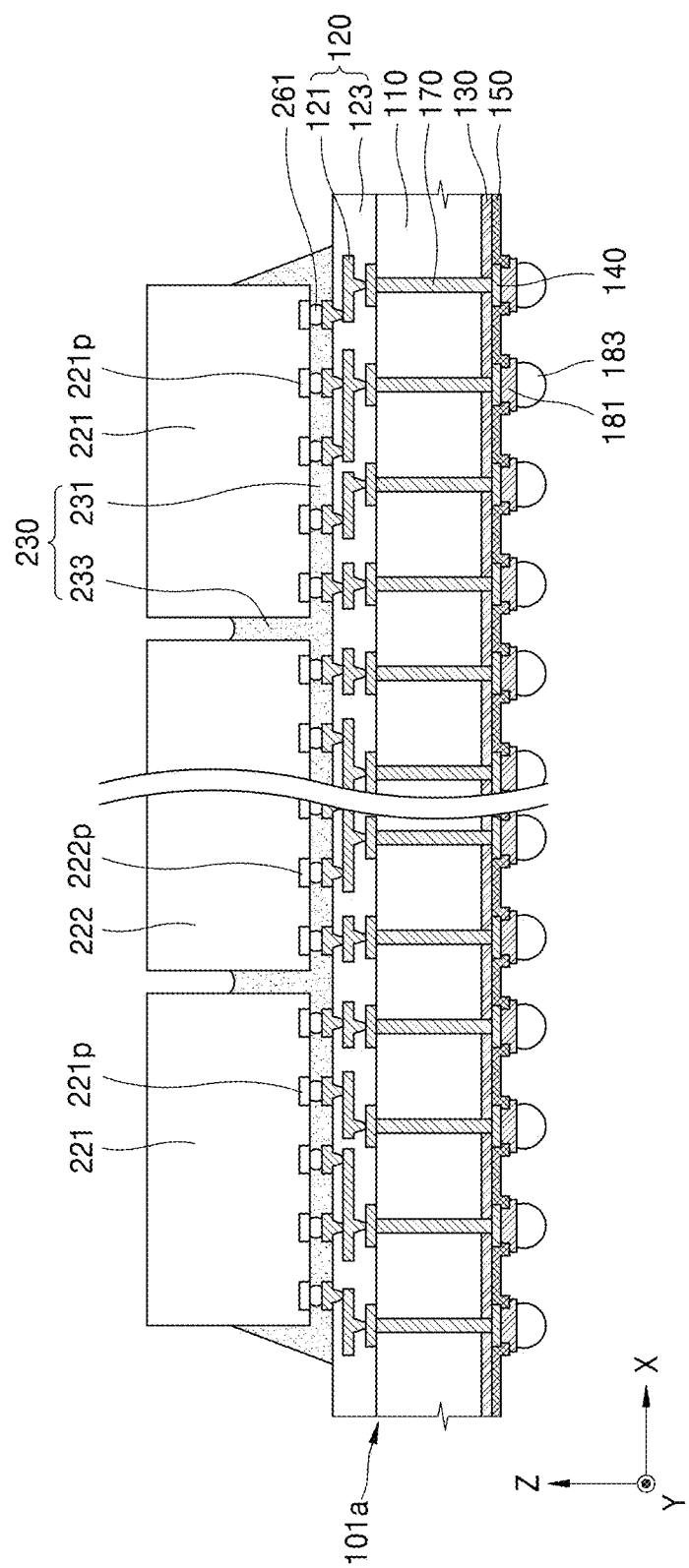

Referring to FIG. 7B, the first insulating filler material 230 filling a gap between the plurality of semiconductor chips 221 and 222 and the interposer substrate 101a and partially filling a gap between the side walls of the plurality of semiconductor chips 221 and 222 may be formed.

For example, the first insulating filler material 230 may be formed by a capillary underfill process using an underfill material. By supplying the underfill material to the gap between the plurality of semiconductor chips 221 and 222 and the interposer substrate 101a, the gap between the plurality of semiconductor chips 221 and 222 and the interposer substrate 101a may be filled with the underfill material. Further, the plurality of semiconductor chips 221 and 222 may be apart from each other at a narrow gap of about 200 µm or less, and the underfill material may fill even between the side walls of the plurality of semiconductor chips 221 and 222.

The underfill material fills the gap between the side walls of the plurality of semiconductor chips 221 and 222 but does not fill an upper part of a gap between side walls of three or more semiconductor chips facing each other. That is, the underfill material fills the gap between the side walls of the plurality of semiconductor chips 221 and 222 but does not fill a region in which the second side-fill part 251 (of FIG. 7D) is to be formed in a subsequent operation. In some example embodiments, to fill the gap between the side walls of the plurality of semiconductor chips 221 and 222 with the underfill material except for the upper part of the gap between the side walls of the three or more semiconductor chips, an amount of the underfill material to be used in a capillary underfill process may be appropriately adjusted. In other example embodiments, after performing a capillary underfill process so that the entire gap between the side walls of the plurality of semiconductor chips 221 and 222 is filled with the underfill material, a portion of the underfill material may be removed by a laser drilling or etching process to form a space in which the second side-fill part 251 is to be formed in a subsequent operation.

Figure 7C:
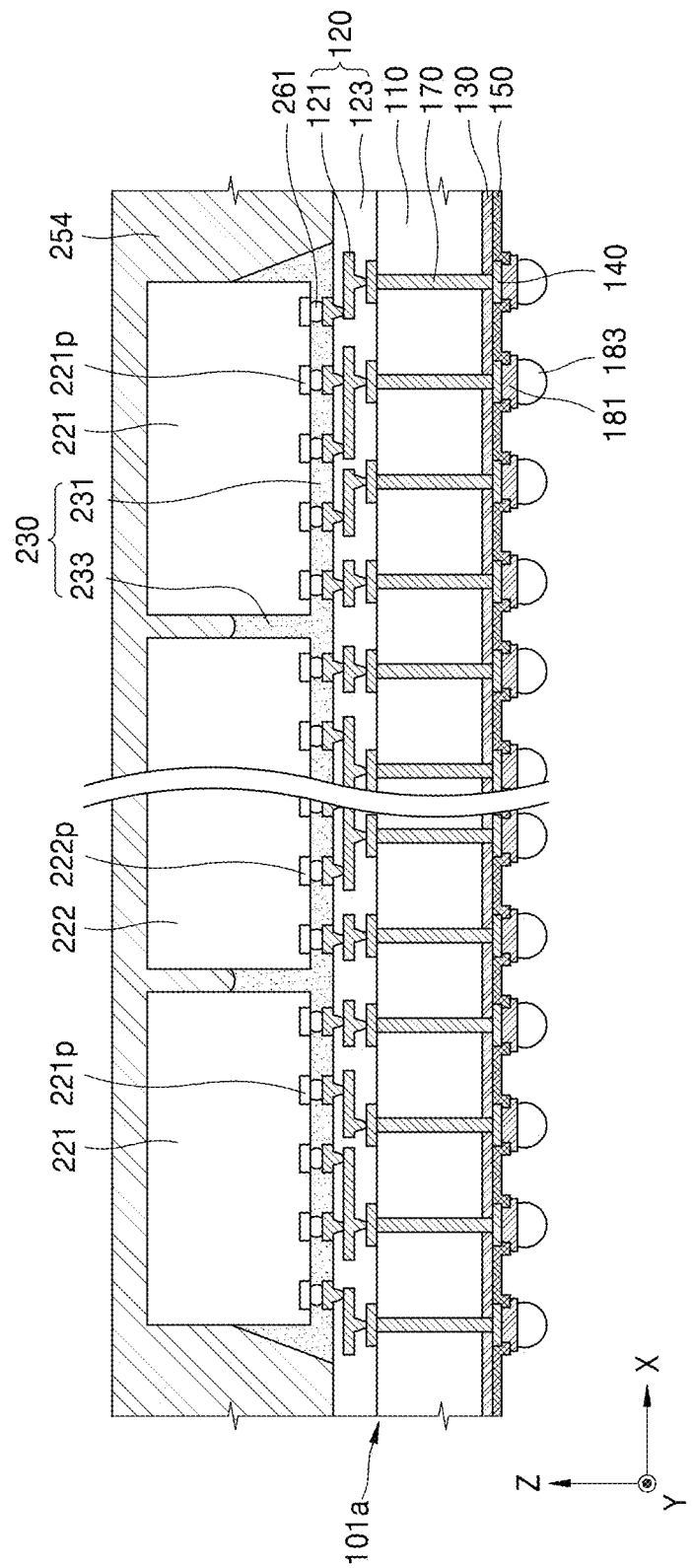

Referring to FIG. 7C, a molding material 254 covering the plurality of semiconductor chips 221 and 222 is formed on the interposer substrate 101a. The molding material 254 may cover the upper surfaces of the plurality of semiconductor chips 221 and 222. Further, the molding material 254 may partially fill the gap between the side walls of the plurality of semiconductor chips 221 and 222.

Figure 7D:
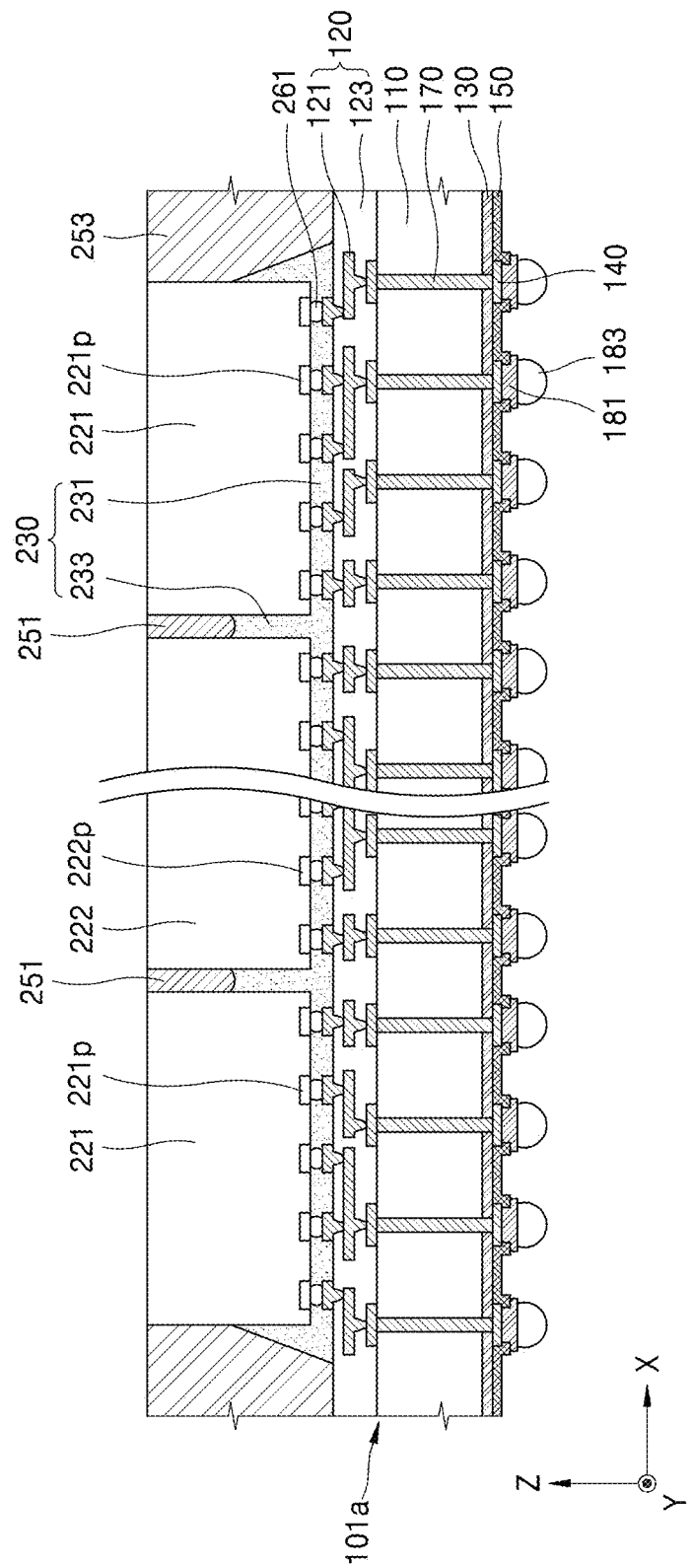

Referring to FIGS. 7C and 7D, a portion of the molding material 254 may be removed to expose the upper surfaces of the plurality of semiconductor chips 221 and 222. For example, to remove the portion of the molding material 254, a chemical mechanical polishing (CMP) process, a grinding process, or the like may be performed. For example, by the polishing process, the portion of the molding material 254, a portion of each of the plurality of semiconductor chips 221 and 222, and/or a portion of the first side-fill part 233 may be removed together.

According to the removal of the portion of the molding material 254, the molding material 254 may be divided into the molding part 253 surrounding the plurality of semiconductor chips 221 and 222 in a lateral direction and the second side-fill part 251 partially filling the gap between the side walls of the plurality of semiconductor chips 221 and 222. Because the molding part 253 and the second side-fill part 251 are formed together by the same process, the molding part 253 and the second side-fill part 251 may have the same material composition.

In some example embodiments, as a result of the polishing process, an exposed upper surface of the molding part 253, exposed upper surfaces of the plurality of semiconductor chips 221 and 222, an exposed upper surface of the first side-fill part 233, and an exposed upper surface of the second side-fill part 251 may be on the same plane (e.g., coplanar).

Figure 7E:
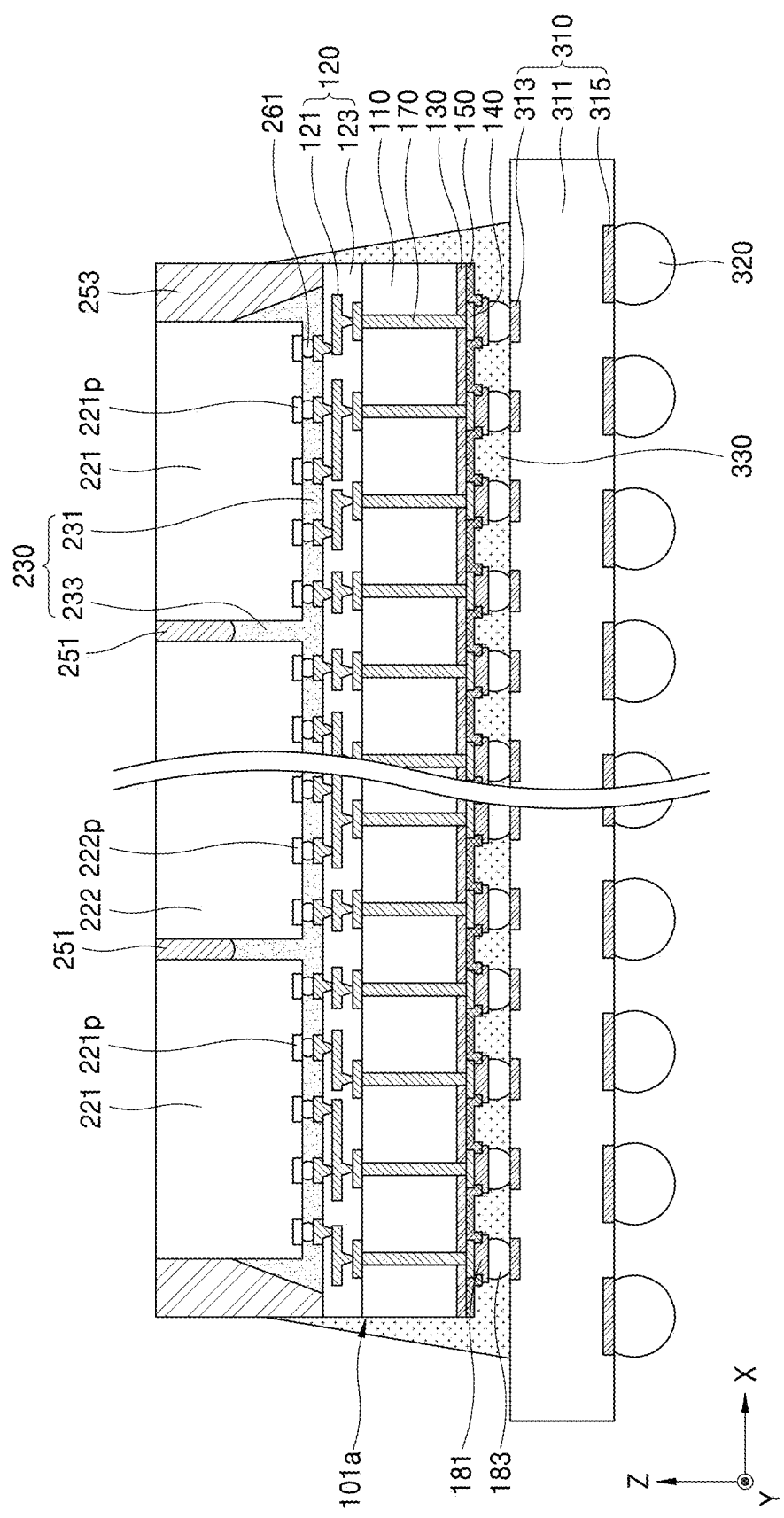

Referring to FIG. 7E, a sawing process is performed on the result of FIG. 7D, and a structure individualized through the sawing process is mounted on the package substrate 310. The interposer substrate 101a may be mounted on the upper surface of the package substrate 310 through the board-interposer connection bump 183.

Thereafter, the second insulating filler material 330 may fill a gap between the interposer substrate 101a and the package substrate 310. The second insulating filler material 330 may surround the board-interposer connection bump 183. Further, a portion of the second insulating filler material 330 may extend along the side wall of the interposer substrate 101a and the side wall of the molding part 253. For example, the second insulating filler material 330 may be formed by a capillary underfill process using an underfill material.

Next, referring to FIG. 6, the thermal interface material 350 may be formed on the upper surfaces of the plurality of semiconductor chips 221 and 222. Thereafter, the heat-dissipating member 340 may be attached onto the thermal interface material 350.

While the inventive concepts has been particularly shown and described with reference to some example embodiments thereof, it will be understood that various changes in form and details may be made therein without departing from the spirit and scope of the following claims.

What is claimed is:

1. A semiconductor package comprising:
   an interposer substrate;
   first to third semiconductor chips on the interposer substrate to face each other;
   an underfill part between each of the first to third semiconductor chips and the interposer substrate;

a first side-fill part extending upward from lower ends of side walls of the first to third semiconductor chips; and
a second side-fill part between the side walls of the first to third semiconductor chips and extending from the first side-fill part to upper ends of the side walls of the first to third semiconductor chips,
wherein an upper surface of the first semiconductor chip comprises a first edge facing the second semiconductor chip, a second edge facing the third semiconductor chip, and a first corner at which the first edge meets the second edge,
an upper surface of the second semiconductor chip comprises a third edge facing the first semiconductor chip, a fourth edge facing the third semiconductor chip, and a second corner at which the third edge meets the fourth edge,
the second side-fill part extends from the first corner of the first semiconductor chip along each of the first edge and the second edge of the first semiconductor chip and extends from the second corner of the second semiconductor chip along each of the third edge and the fourth edge of the second semiconductor chip, and
a coefficient of thermal expansion of the second side-fill part is less than a coefficient of thermal expansion of the first side-fill part.

2. The semiconductor package of claim 1, wherein the second side-fill part is in contact with a portion of the first edge and a portion of the second edge of the first semiconductor chip and a portion of the third edge and a portion of the fourth edge of the second semiconductor chip.

3. The semiconductor package of claim 2, wherein the first side-fill part is in contact with a remaining portion of the first edge and a remaining portion of the second edge of the first semiconductor chip and a remaining portion of the third edge and a remaining portion of the fourth edge of the second semiconductor chip.

4. The semiconductor package of claim 1, wherein the first semiconductor chip, the second semiconductor chip, and the third semiconductor chip are apart from each other at a distance of about 20 μm to about 200 μm.

5. The semiconductor package of claim 1, wherein first content of a filler contained in the second side-fill part is greater than second content of a filler contained in the first side-fill part.

6. The semiconductor package of claim 1, wherein a particle size of a filler contained in the second side-fill part is greater than a particle size of a filler contained in the first side-fill part.

7. The semiconductor package of claim 1, further comprising:
a molding part on the interposer substrate to mold the first to third semiconductor chips, the molding part including a same material as the second side-fill part;
a package substrate under the interposer substrate; and
an insulating filler material filling between the package substrate and the interposer substrate and covering a portion of a side wall of the molding part and a side wall of the interposer substrate.

8. The semiconductor package of claim 7, further comprising:
a heat-dissipating member on the first to third semiconductor chips; and
a thermal interface material between the first to third semiconductor chips and the heat-dissipating member.

9. The semiconductor package of claim 1, wherein the interposer substrate comprises:
a base layer including silicon;
a redistribution structure arranged on the base layer and comprising a conductive redistribution pattern; and
a through electrode passing through the base layer and electrically connected to the conductive redistribution pattern.

10. A semiconductor package comprising:
a base;
at least three semiconductor chips on the base to face each other, the at least three semiconductor chips electrically connected to the base, the at least three semiconductor chips comprising a first semiconductor chip, a second semiconductor chip, and a third semiconductor chip;
an underfill part between the at least three semiconductor chips and the base;
a first side-fill part extending upward from lower ends of side walls of the at least three semiconductor chips; and
a second side-fill part between the side walls of the at least three semiconductor chips and extending from the first side-fill part to upper ends of the side walls of the at least three semiconductor chips,
wherein the second side-fill part is in contact with each of the at least three semiconductor chips,
first content of a filler contained in the second side-fill part is greater than second content of a filler contained in the first side-fill part,
when viewed in a plan view, the second side-fill part is surrounded by the first side-fill part and is at a position at which the at least three semiconductor chips adjoin each other, and
when viewed in a plan view, the second side-fill part comprises a first portion between the first semiconductor chip and the second semiconductor chip, a second portion between the second semiconductor chip and the third semiconductor chip, and a third portion between the first semiconductor chip and the third semiconductor chip, the first to third portions of the second side-fill part connected to each other as a unitary mass.

11. The semiconductor package of claim 10, wherein the base comprises a semiconductor chip or an interposer substrate.

12. The semiconductor package of claim 10, wherein
an upper surface of the first semiconductor chip comprises a first edge facing the second semiconductor chip, a second edge facing the third semiconductor chip, and a first corner at which the first edge meets the second edge, and
the second side-fill part extends from the first corner of the first semiconductor chip along each of the first edge and the second edge of the first semiconductor chip.

13. The semiconductor package of claim 12, wherein
the second side-fill part is in contact with a portion of the first edge and a portion of the second edge of the first semiconductor chip, and
the first side-fill part is in contact with a remaining portion of the first edge and a remaining portion of the second edge of the first semiconductor chip.

14. The semiconductor package of claim 13, wherein
an upper surface of the second semiconductor chip comprises a third edge facing the first semiconductor chip, a fourth edge facing the third semiconductor chip, and a second corner at which the third edge meets the fourth edge,
the second side-fill part extends from the second corner of the second semiconductor chip along each of the third edge and the fourth edge of the second semiconductor chip, the second side-fill part is in contact with a portion of the third edge and a portion of the fourth edge of the second semiconductor chip, and the first side-fill part is in contact with the other portion of the third edge and the other portion of the fourth edge of the second semiconductor chip.

15. The semiconductor package of claim 10, wherein
the at least three semiconductor chips comprise four semiconductor chips arranged in a quadrangular form, and the second side-fill part is in contact with each of the four semiconductor chips and has a cross shape in a plan view.

16. The semiconductor package of claim 10, wherein upper surfaces of the at least three semiconductor chips are coplanar with an upper surface of the first side-fill part and an upper surface of the second side-fill part.

17. The semiconductor package of claim 10, further comprising:

a molding part on the base, the molding part molding the at least three semiconductor chips and including a same material as the second side-fill part.

18. The semiconductor package of claim 17, wherein the molding part covers upper surfaces of the at least three semiconductor chips and is connected to the second side-fill part.

19. A semiconductor package comprising:

an interposer substrate;

a plurality of semiconductor chips on the interposer substrate, each of the plurality of semiconductor chips comprising a lower surface facing the interposer substrate and an upper surface that is opposite to the lower surface, the plurality of semiconductor chips comprising a first semiconductor chip, a second semiconductor chip, and a third semiconductor chip;

a first side-fill part filling between side walls of the plurality of semiconductor chips and extending upward from lower ends of the side walls of the plurality of semiconductor chips; and a second side-fill part between the side walls of the plurality of semiconductor chips and extending downward from upper ends of the side walls of the plurality of semiconductor chips, wherein the second side-fill part is in contact with an upper portion of at least one of side walls of each of the plurality of semiconductor chips, the first side-fill part is in contact with a remaining portion of the at least one of the side walls of each of the plurality of semiconductor chips, and a particle size of a filler contained in the second side-fill part is greater than a particle size of a filler contained in the first side-fill part, and when viewed in a plan view, the second side-fill part is surrounded by the first side-fill part and is at a position at which the plurality of semiconductor chips adjoin each other, and when viewed in a plan view, the second side-fill part comprises a first portion between the first semiconductor chip and the second semiconductor chip, a second portion between the second semiconductor chip and the third semiconductor chip, and a third portion between the first semiconductor chip and the third semiconductor chip, the first to third portions of the second side-fill part connected to each other as a unitary mass.

* * * * *